United States Patent
Ezz et al.

(10) Patent No.: US 11,177,771 B2
(45) Date of Patent: Nov. 16, 2021

(54) MULTI-CORE MIXERS WITH LOCAL OSCILLATOR LEAKAGE COMPENSATION

(71) Applicant: ANALOG DEVICES INTERNATIONAL UNLIMITED COMPANY, LIMERICK (IE)

(72) Inventors: Amr Reda Saad Ezz, Cairo (EG); Ahmed Essam Eldin Mahmoud Amer, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/156,669

(22) Filed: Oct. 10, 2018

(65) Prior Publication Data

US 2020/0119693 A1 Apr. 16, 2020

(51) Int. Cl.
*H03D 7/14* (2006.01)
*H04B 1/04* (2006.01)

(52) U.S. Cl.
CPC ......... *H03D 7/1458* (2013.01); *H03D 7/1441* (2013.01); *H03D 7/1466* (2013.01); *H04B 1/0475* (2013.01)

(58) Field of Classification Search
CPC ........... H03D 7/1458; H03D 2200/009; H03D 7/165; H03D 7/1433; H03D 2200/0043;
(Continued)

(56) References Cited

U.S. PATENT DOCUMENTS

| 5,001,773 A | 3/1991 | White |
| 6,073,001 A | 6/2000 | Sokoler |

(Continued)

FOREIGN PATENT DOCUMENTS

EP 1478097 11/2004

OTHER PUBLICATIONS

Byeon, Chul Woo et al., "A High Linearity, Image/LO-Rejection I/Q Up-Conversion Mixer for 5G Cellular Communications," Proceedings of the 10th European Microwave Integrated Circuits Conference, 2015, pp. 345-348.
(Continued)

*Primary Examiner* — Ajibola A Akinyemi
(74) *Attorney, Agent, or Firm* — Knobbe, Martens, Olson & Bear, LLP

(57) ABSTRACT

Systems and methods are disclosed for compensating local oscillator leakage in a mixer. An example mixer includes a first double-balanced mixer core and a second double-balanced mixer. The first double-balanced mixer may comprise differential output nodes and may be configured to mix a first input signal with a first local oscillator signal. The second double-balanced mixer core may comprise second differential output nodes and may be configured to mix a second input signal with a second local oscillator signal. The second input signal may be approximately 180° out of phase with the first input signal. The second local oscillator signal may be approximately 180° out of phase with the first local oscillator signal. The differential output nodes may be electrically connected to the second differential output nodes, and the first double-balanced mixer core and the second double-balanced mixer core may be arranged to compensate for local oscillator leakage.

20 Claims, 5 Drawing Sheets

(58) Field of Classification Search
CPC .... H03D 7/1441; H03D 7/145; H03D 7/1475; H03D 2200/0019; H03D 2200/0023; H03D 2200/0074; H03D 7/1425; H03D 7/1466
USPC ...................................................... 455/114.2
See application file for complete search history.

(56) References Cited

U.S. PATENT DOCUMENTS

| | | | |
|---|---|---|---|
| 6,167,247 A | 12/2000 | Kannell et al. | |
| 6,766,157 B1 | 7/2004 | Hunzeker et al. | |
| 6,807,407 B2 | 10/2004 | Ji | |
| 8,244,197 B2* | 8/2012 | Fujii | H03H 7/20 455/302 |
| 9,621,387 B1* | 4/2017 | Magers | H04B 1/48 |
| 2003/0109238 A1 | 6/2003 | Kim et al. | |
| 2003/0157902 A1 | 8/2003 | Khorram | |
| 2004/0043741 A1 | 3/2004 | Goddard et al. | |
| 2009/0203347 A1* | 8/2009 | Kaczman | H04B 1/30 455/326 |
| 2010/0093299 A1* | 4/2010 | Pinel | G06G 7/12 455/226.1 |
| 2011/0092169 A1* | 4/2011 | Savoj | H03H 7/21 455/73 |

OTHER PUBLICATIONS

Tsuki, Yuki et al., "A 60 GHz up-conversion mixer using asymmetric layout with −41.1 dBc LO leakage," IEEE, 2013, pp. 1-4.

Wang, Haiyong et al., "A LO-leakage auto-calibrated CMOS IEEE802.11b/g WLAN transceiver," IEEE, 2007, pp. 3912-3915.

Yamada, Shuhei et al., "Cancellation Techniques for LO Leakage and DC Offset in Direct Conversion Systems," IEEE, 2008, pp. 1191-1194.

Asami, Koji, "An Algorithm to Evaluate Wide-band Quadrature Mixers," IEEE International Test Conference Paper 28.2, pp. 1-7, 2007.

Behzad, Arya, et al., "A 5-GHz Direct-Conversion CMOS Transceiver Utilizing Automatic Frequency Control for the IEEE 802.11a Wireless LAN Standard," IEEE Journal of Solid-State Circuits, vol. 38, No. 12, pp. 2209-2220, Dec. 2003.

Nash, Eamon, "Correcting Imperfections in IQ Modulators to Improve RF Signal Fidelity," Analog Devices, AN-1039 Application Note, pp. 1-8, Rev. 0, copyright 2009.

Sen, Shreyas, et al., "DSP Assisted Low Cost IQ Mismatch Measurement and Compensation Using Built in Power Detector," IEEE, IMS, pp. 336-339, 2010.

Tseng, Shen-Che, "Ka/Ku-Band pHEMT Gilbert Mixers with Polyphase and Coupled-Line Quadrature Generators", IEEE Transactions on Microwave Theory and Techniques, May 5, 2009, pp. 1063-1073, vol. 57.

Ang, K.S. et al. "K-band Monolithic Double-Balanced Resistive Mixer with Integrated Balanced Oscillator", IEEE MTT-S Digest, 2001, pp. 1329-1332.

Extended European Search Report dated Feb. 26, 2020 issued to International Application No. 19201690.5.

\* cited by examiner

MULTI-CORE MIXERS WITH LOCAL OSCILLATOR LEAKAGE COMPENSATION

FIELD OF THE DISCLOSURE

The described technology generally relates to electronics and, more specifically, to mixers.

BACKGROUND

Mixers are often used in various circuits, such as radio frequency (RF) receivers and transmitters, for functions such as down converting or up converting. Generally, for mixers, such as diode ring mixers or field effect transistor (FET) ring mixers, local oscillator (LO) leakage can corrupt purity of signals output by the mixers, for example, cross modulation, desensitization, harmonic generation, gain compression, and/or degradation in the signal-to-noise and distortion ratio (SNDR). Due to various inherent characteristics of mixer elements, such as physical layout, signal crossing, component interferences, and various other design considerations and trade-offs in mixer design, reducing LO leakage in a mixer can be challenging.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

In some aspects, a mixer with local oscillator leakage compensation is disclosed. The mixer comprises a first double-balanced mixer core comprising differential output nodes, the first double-balanced mixer core configured to mix a first input signal with a first local oscillator signal. The mixer also comprises a second double-balanced mixer core comprising second differential output nodes, the second double-balanced mixer core configured to mix a second input signal with a second local oscillator signal, the second input signal being approximately 180° out of phase with the first input signal and the second local oscillator signal being approximately 180° out of phase with the first local oscillator signal. The differential output nodes are electrically connected to the second differential output nodes. The first double-balanced mixer core and the second double-balanced mixer core are arranged to compensate for local oscillator leakage.

In another aspect, a transmitter with local oscillator leakage compensation is disclosed. The transmitter comprises a multi-core mixer configured to upconvert input signals and provide a radio frequency output signal and a radio frequency amplifier. The multi-core mixer comprises a first double-balanced mixer core configured to mix a first input signal with a first local oscillator signal. The multi-core mixer also comprises a second double-balanced mixer core configured to mix a second input signal with a second local oscillator signal, the second input signal being approximately 180° out of phase with the first input signal and the second local oscillator signal being approximately 180° out of phase with the first local oscillator signal. The multi-core mixer is configured to generate the radio frequency output signal by at least combining a first output signal from the first double-balanced mixer with a second output signal from the second double-balanced mixer so as to compensate for local oscillator leakage. The radio frequency amplifier comprises an input coupled to an output of the multi-core mixer.

In an additional aspect, a method of mixing signals with local oscillator leakage compensation is disclosed. The method comprise providing a first local oscillator signal to a first double-balanced mixer core and a second local oscillator signal to a second double-balanced mixer core, wherein the second local oscillator signal is approximately 180° out of phase with the first local oscillator signal. The method also comprises mixing, with the first double-balanced mixer core, a first input signal with the first local oscillator signal to generate a first differential output signal. The method further comprises mixing, with the second double-balanced mixer core, a second input signal with the second local oscillator signal to generate a second differential output signal, wherein the second input signal is approximately 180° out of phase with the first input signal. The method additionally comprises combining the first differential output signal with the second differential output signal to compensate for local oscillator leakage.

BRIEF DESCRIPTION OF THE DRAWINGS

The following drawings and the associated description herein are provided to illustrate specific embodiments of the disclosure and are not intended to be limiting.

DETAILED DESCRIPTION

Figure 1:
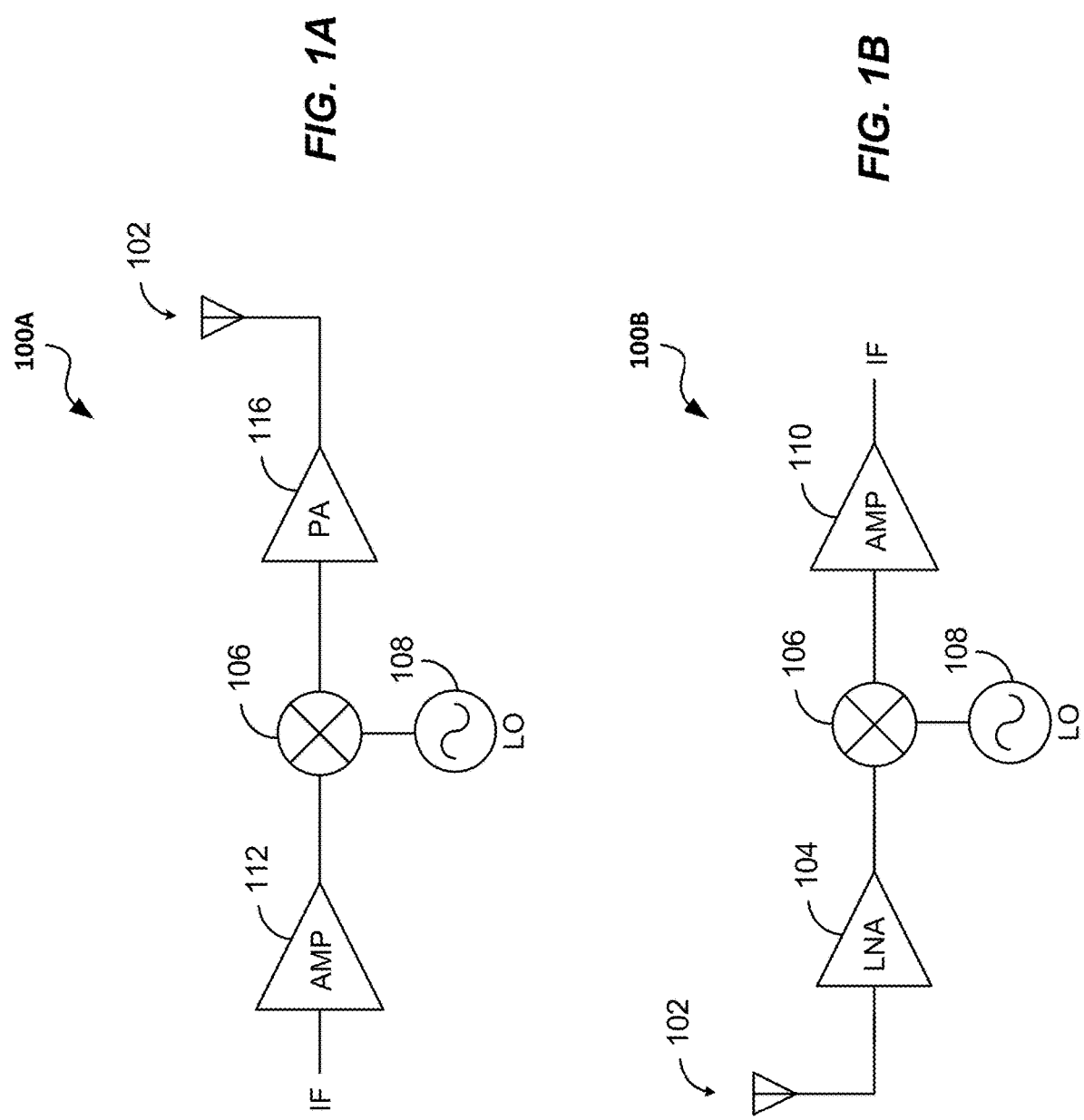
FIG. 1A is a diagram of an example implementation of the technology disclosed herein in a transmitter according to one embodiment.
FIG. 1B is a diagram of another example implementation of the technology disclosed herein in a receiver according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Mixers, such as double balanced mixers, can introduce local oscillator leakage into a transmitter or a receiver. For example, layout mismatches in signal routing can result in local oscillator feedthrough in a mixer. Local oscillator signal amplitude and/or phase mismatches can also cause local oscillator leakages. The local oscillator leakage can be difficult to suppress.

Some techniques to compensate for local oscillator leakage are based on calibration circuits that involve a relatively long calibration time. In some techniques, calibration settings can be different for different frequency bands. Accordingly, there is a need for improved local oscillator leakage compensation.

Aspects of this disclosure relate to compensating for local oscillator leakage with a multi-core double balanced mixer. A pair of double balanced mixer cores can receive local oscillator signals that are 180° out of phase with each other and input signals that are 180° out of phase with each other. Each of the double balanced mixer cores of the pair can have local oscillator leakage that is 180° out of phase. The outputs of the pair of double balanced mixer cores can be combined. This can cause local oscillator leakage from each core of the pair of double balanced mixer cores to cancel. Accordingly, such multi-core double balanced mixers can compensate for local oscillator leakage. In the multi-core double balanced mixer, a pair of mixer cores can have layouts that are substantially symmetrical about a line to compensate for layout mismatches. The local oscillator leakage compensation disclosed herein can be effective across a variety of frequency bands and/or an entire bandwidth of a mixer.

Many mixers may utilize intermediate frequency (IF) and/or radio frequency (RF) filtering to compensate for RF front end imperfections. For example, the RF front end imperfections may be caused by IQ mismatch or imbalance, local oscillator (LO) leakage, direct current (DC) offset, the like, or any combination thereof. Such RF front end imperfections may corrupt a spectral purity of a corresponding signal in the mixer. The RF front end imperfections may result in a higher bit error rate (BER) in a communication system using such mixers. The imperfections may be problematic in wideband communication systems, especially where increased component scaling and integration is employed to generate a system-on-chip (SoC) implementation of a mixer and transmitter system. Such an SoC implementation may introduce additional stringent specifications regarding the signals and/or corresponding qualities of the various components.

While the IF and/or RF filtering can compensate for the RF front end imperfections (for example in super-heterodyne transmitter and receiver architectures), such filtering may increase a quantity of components desired in, a cost of, and the complexity of the mixers used in communication architectures. As communication circuits that operate across multiple bands and/or multiple standards grow in popularity and demand, reduced reliance on RF filtering reduces complexities involved with the communication circuits. Direct conversion and low IF architectures have gained increased attention due to their potential to provide relatively low power consumption and relatively high level integration. However, other techniques may be better suited to deal with system impairments that lead to the RF front end imperfections. For example, an asymmetric circuit layout may decrease mismatch of capacitors in the mixer and improve RF-LO isolation. Additionally, a dual-core IQ mixer topology may reduce direct LO feedthrough that would otherwise arise from mixer circuit layout mismatch in signal routing through the core(s) while also reducing LO signal amplitude and phase mismatches.

Example mixers based on the dual-core IQ mixer topology are described below, for example in FIGS. 4A-5. The example mixers include a double balanced, multicore topology. Such double-balanced, multicore mixers may benefit from increased linearity and/or improved suppression of RF front end imperfections and improved isolation between ports of the mixers. Improved isolation and suppression of imperfections can result in the transmissions generated with these mixers may have less noise and other imperfections.

While the mixers herein are generally described in relation to application in a transmit circuit where an IF signal is converted to the RF output, such mixers may similarly be used in a receive circuit, where the RF signal is converted to the IF output. Moreover, mixers disclosed herein can convert signals between baseband and RF.

FIG. 1A is a diagram of an example implementation of the technology disclosed herein in a transmitter 100A according to one embodiment. The illustrated transmitter 100A includes an amplifier 112, the mixer 106, the local oscillator 108, a power amplifier 116, and the antenna 102. In certain embodiments, the amplifier 112, the mixer 106, and the power amplifier 116 can be included on an integrated circuit. A band pass filter may be included between the mixer 106 and the amplifier 116. The antenna 102 and the local oscillator 108 can be external to or part of the integrated circuit. It will be understood that the transmitter and/or receiver illustrated in FIGS. 1A-1B may include fewer or more elements than illustrated. In certain implementations, the receivers and/or transmitters disclosed herein can include additional elements or components, such as baluns or transformers for providing differential or single-ended signals, intermediate frequency (IF) bandpass filters for filtering out unwanted harmonics, etc. As another example, any of the illustrated antennas can be used for both transmitting RF signals and receiving RF signals and a switch can selectively electrically connect a transmit path or a receive path to such an antenna. As described herein, same or corresponding numerals and/or names of elements in FIGS. 1A-5 and their descriptions indicate the elements having similar or corresponding functionalities and/or characteristics.

The illustrated transmitter 100A includes the amplifier 112 that receives an IF signal and outputs an amplified IF signal to the mixer 106. The local oscillator 108 can provide a local oscillator signal to the mixer 106. In some implementations, the local oscillator 108 can provide a differential local oscillator signal to the mixer 106. The power amplifier 116 receives a mixer output from the mixer 106, and the power amplifier 116 provides an amplified RF signal to the antenna 102 to be transmitted.

FIG. 1B is a diagram of another example implementation of the technology disclosed herein in a receiver 100B according to one embodiment. The illustrated receiver 100B includes an antenna 102, a low noise amplifier (LNA) 104, a mixer 106, a local oscillator 108, and an amplifier 110. In certain embodiments, the LNA 104, the mixer 106, and the amplifier 110 can be included on a single integrated circuit. A low pass filter may be included between the mixer 106 and the amplifier 110. The antenna 102 and/or the local oscillator 108 can be external or internal to the integrated circuit.

The illustrated receiver 100B can receive an RF signal at the antenna 102, and the RF signal can be provided to the LNA 104. An RF signal can have a frequency in the range from about 30 kHz to 300 GHz, such as in a range from about 450 MHz to about 8.5 GHz for certain communications standards. The LNA 104 can amplify the received RF signal and provide the amplified RF signal to the mixer 106. The local oscillator 110 can provide a local oscillator signal to the mixer 106. In some implementations, the local oscillator 108 can provide a differential local oscillator signal to the mixer 106. The amplifier 110 receives a mixer output from the mixer 106, and the amplifier 112 may output an amplified IF signal for further processing.

The mixers 106 illustrated in FIGS. 1A-1B may fully differential mixers receiving differential signal input, differential LO input, and/or producing differential signal output. In some embodiments, the mixers disclosed herein can be implemented with rectifiers or diodes, such as P-N junction diodes, Schottky barrier diodes, GaAs diodes, semiconductor diodes, or the like. According to an embodiment, mixers disclosed herein can include SiGe BiCMOS transistors. In some embodiments, the mixers disclosed herein can be implemented with field effect transistors (FETs), such as metal oxide semiconductor (MOS) transistors, which can be in complementary form, junction field effect transistors (JFETs), laterally diffused metal oxide semiconductor (LDMOS) transistors, GaAs metal semiconductor field effect transistors (GaAs MESFETs), pseudomorphic high electron mobility transistors (pHEMTs), or the like. While the terms "metal" and "oxide" may be present in for example, MOS, such transistors can have gates made out of materials other than metals, such as polysilicon, and have dielectric oxide regions made from dielectrics other than silicon oxide, such as a high-κ dielectric. According to some other embodiments, mixers implemented in accordance with the principles and advantages discussed herein can be with bipolar transistors, such as SiGe bipolar transistors or GaAs heterojunction bipolar transistors.

The mixers 106 in the illustrated circuits 100A, 100B in FIGS. 1A-1B can be implemented with any suitable principles and advantages of any of the example mixers 206a-b, 300, 400, 500 illustrated in, and described in connection with, FIGS. 2-5 below. Any suitable combination of the principles and advantages of any of FIGS. 2-5 can be implemented in a mixer 106 of FIG. 1A and/or FIG. 1B.

Figure 2:
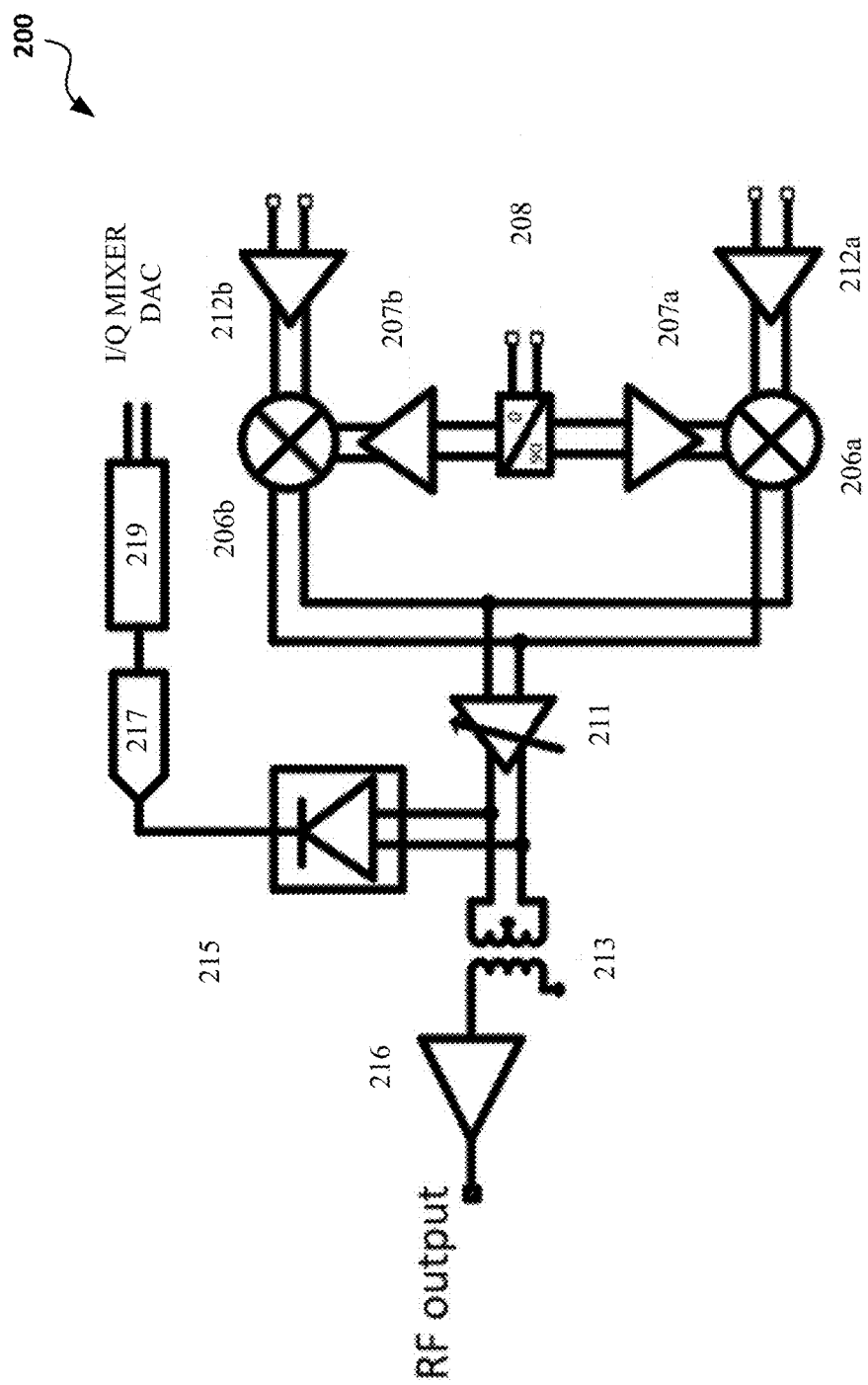
FIG. 2 illustrates a schematic diagram of a direct conversion transmitter.

FIG. 2 illustrates a simplified schematic diagram of an example direct conversion transmitter 200. As illustrated, the transmitter 200 includes an LO input 208 and LO buffers 207a-b, mixers 206a-b, baseband amplifiers 212a-b, an RF variable gain amplifier (VGA) 211, a balun 213, an envelope detector 215, a power amplifier 216, an analog-to-digital converter (ADC) 217, and a digital control circuit 219. The example transmitter 200 comprises an IQ Mixer circuit that may up-convert an input signal (for example, a baseband or intermediate frequency signal) to generate an output signal (for example, a carrier frequency signal). The transmitter 200 may comprise a phase-locked loop and LO chain and LO buffers or amplifiers 207a-b to drive a first mixer 206a and a second mixer 206b. The first and second mixers 206a-b may receive baseband or intermediate frequency signals from baseband amplifiers 212a-b, respectively, and LO signals from the LO buffers 207a-b, respectively. In some embodiments, the LO buffers 207a-b may receive LO signals from the LO chain that comprises an LO input 208 that is coupled to an LO, where the LO signals for the LO buffers 207a-b may be out of phase, for example with a 90-degree offset, from each other. The mixers 206a-b may each have digital controls based on which the mixers 206a-b may cancel at least a portion of LO leakage generated in or by the transmitter 200. The transmitter 200 may also include an RF variable gain amplifier (VGA) 211 to enable the transmitter 200 to transmit at different power levels. The transmitter 200 may also include a power amplifier 216 following a balun 213 (or a similar transformer) to generate power for driving a transmit antenna (not shown) based on the RF signal. The transmitter 200 also includes a calibration circuit comprising an envelope detector 215, an analog-to-digital converter (ADC) 217, and a digital control circuit 219. The envelope detector 215 may covert the RF signal to a simpler form with a lower frequency, thereby making on-chip implementation or analysis feasible. The ADC 217 may perform analog-to-digital conversions as needed, while the digital control circuit 219 may process the band signal and adjust the digital controls of the transmitter 200 to optimize transmission response.

LO isolation from generated RF output signals can be one of the most important features and functions of up-converter mixers. In some aspects, a double balanced mixer topology may be implemented in a transmitter (for example, the transmitter 200) to benefit from the double balanced mixer's LO rejection and elimination capabilities. However, at relatively high LO signal frequencies, irregularities and/or mismatches in a single core layout of the double balanced mixer may generate LO leakage within the mixer itself due to routing of the LO signals (and/or other signals) within the mixer core(s).

Figure 3:
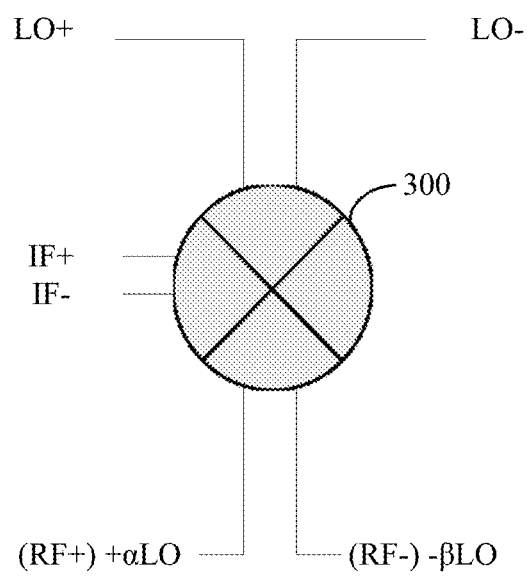
FIG. 3 illustrates a block diagram of a double balanced single core mixer, according to an embodiment.

FIG. 3 illustrates a block diagram of a double balanced single core mixer 300, according to an embodiment. The illustrated mixer 300 includes a differential LO input, a differential IF input, and a differential RF output and may have a typical double balanced mixer core layout (not shown in detail in this figure). Given the typical single core layout of the mixer 300, an effective LO feedthrough at RF+ may be positive with a factor of α while the effective LO feedthrough at RF− may be negative with a factor of β. The output RF signal may be determined according to Equation (1) below:

$$\text{RF out}=(\text{RF}+)-(\text{RF}-)+(\alpha+\beta)\text{LO} \tag{1}$$

The factors α a and β may be caused by effects of the mixer 300 circuitry and components on the signals being processed by the mixer 300, amplitude mismatches one or more of the LO, IF, or RF signals, and so forth. For example, when the mixer 300 is processing the IF+ signal and generating the RF+ signal with the +αLO feedthrough (or processing the IF− signal and generating the RF− signal with the −βLO feedthrough), the +αLO (or the −βLO) feedthrough may be generated based on how the IF, RF, and LO signals are routed and handled (for example, how the inputs and/or outputs cross) within the mixer 300. For example, a location of the IF inputs and the corresponding IF signals in relation to the inputs or routing of the LO signals may create interference or otherwise generate the LO feedthrough for the RF signals being generated by the mixer 300.

In some mixer 300 layouts, the α and β factors of the +LO and −LO feedthrough may have different values dependent on the routing of the IF, RF and LO signals within the mixer 300. For example, the structure and layout of the mixer 300 may limit available locations for the IF and LO inputs and the RF outputs. The signal flow of the LO signals in relation to the locations of the IF inputs (and vice versa of the IF signals in relation to the LO inputs) may impact the +αLO and the −βLO feedthrough generated within the mixer 300. Because the paths of the +LO and −LO signals may be different, the α and β factors may have different values, where the values of the α and β factors are associated with the routing of signals within the mixer 300. For example, where the +LO signal passes near the IF inputs and the −LO signal is routed away from the IF inputs, then +LO signal may gain the α factor having a greater value than the β factor of the −LO signal.

In some embodiments, it may not be possible to ensure the α and β factors have the same values. For example, it may not be possible to ensure that the α and β factors are the same using single core mixer 300 layouts or similar techniques because the six mixer 300 inputs and outputs (the two LO (differential) inputs, two IF (differential) inputs, and two RF (differential) outputs) may not be able to be symmetrically integrated into the single core mixer 300 in a way that would make the α and β factors equal. Accordingly, due to the unbalanced crossing of the mixer core inputs and outputs within the single core mixer 300, the leakage components may pass through the mixer 300 generating the different α and β values that result in +LO and −LO components that cannot be reduced without use of filters or similar components. For example, because the α and β factors have different values, simply combining the outputs of the RF+ and RF− signals will not result in the elimination of the +αLO and −βLO feedthrough.

In some aspects, to reduce and/or eliminate the +αLO and −βLO feedthrough, the mixer 300 may be formed from or by pairwise multiples of cores, with the cores of each pair having opposite or flipped layouts relative to each other. Any even number of mixer cores may be used for implementation of the mixer 300 according to this technique, where each pair of cores have LO and IF inputs that are 180-degrees out-of-phase with each other. Specifically, the cores of each pair of cores may have corresponding or similar layouts that are flipped relative to the corresponding LO and IF inputs and routing. Additionally, the LO inputs may be split (for example, using a signal splitter or divider, such as a Wilkinson, or similar, splitter or divider) for each pair of cores such that each pair of cores receives a relative portion of the LO signal. In such an aspect where the LO inputs are split, the RF outputs may be combined (for example, using a signal combiner, such as a Wilkinson, or similar, combiner) as each pair of cores may generate a portion of the RF output signal.

Figures 4A, 4B:
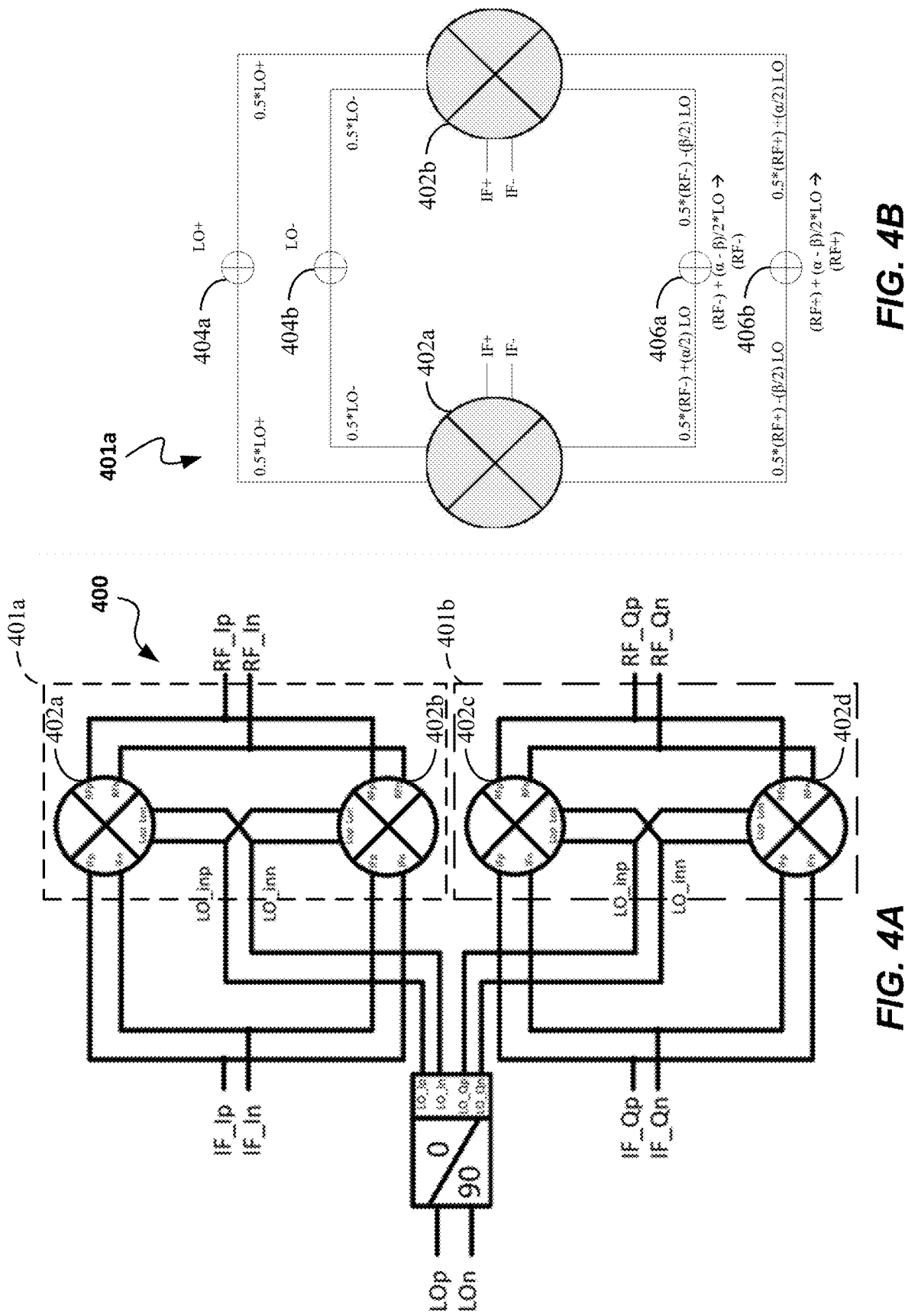
FIG. 4A illustrates a schematic diagram of a dual-core double balanced mixer according to an embodiment.
FIG. 4B is a block diagram of a dual-core double balanced mixer of FIG. 4A showing local oscillator (LO) feedthrough components through the mixer and at the radio frequency (RF) output, according to an embodiment.

FIG. 4A illustrates a schematic diagram of an IQ dual-core double balanced mixer 400 according to an embodiment. The IQ dual-core double balanced mixer 400 may comprise four individual (or single) mixer cores 402a-d arranged to form two dual-core double balanced mixers 401a-b each having two cores (a first dual-core double balanced mixer 401a comprising mixer cores 402a-b and a second dual-core double balanced mixer 401b comprising mixer cores 402c-d). Each of the individual mixer cores 402 may include inputs and outputs (for example, the two LO (differential) inputs, two IF (differential) inputs, and two RF (differential) outputs). In some embodiments, the outputs of a pair of cores 402 are coupled together to merge or combine the outputs. For example, the RF outputs of the mixer cores 402a and 402b (and the RF outputs of the mixer cores 402c and 402d) are merged or combined at a combiner (such as a Wilkinson or similar signal combiner).

As described herein, the orientations or layouts (specifically, the input locations and routing of the LO and IF signals) of the two mixer cores 402a-b and 402c-d forming each of the dual-core double balanced mixers 40a-b may be flipped relative to each other. Thus, the mixer core 402a may have a flipped orientation or layout (for LO and IF input location and signal routing) as compared to the mixer core 402b and the mixer core 402c may have a flipped orientation or layout (for LO and IF input location and signal routing) as compared to the mixer core 402d. Due to this flipped orientation between the mixer cores 402 forming the dual-core double balanced mixer 401, the α and β factors of the LO leakage components (+αLO and −βLO feedthrough described herein) generated at the RF port of each mixer core 402 may be equal or substantially equal or the same in value. For example, the routing of the +LO signal may be similarly influenced by the IF inputs and/or other components of the mixer core 402 as the −LO signal because their respective routings may expose the +LO and −LO signals to the substantially the same interferences, and so forth. Since the RF outputs (with the corresponding +αLO and −βLO feedthrough components) may be out of phase, the +α and −β factors may, being of the same or substantially similar values, cause the +LO and −LO components to cancel at the combiner and the RF signal components should be in phase and combine or sum mathematically. Thus, by summing the out of phase +αLO and −βLO leakage components and the +/−RF signal components, the LO leakage is cancelled and the RF is merged, thereby compensating for the LO leakage at the output of each mixer core 401 of the double balanced mixer 400 as compared to, for example, the double balanced mixer 300 that may be formed from a single core. This compensation can reduce and/or eliminate LO leakage at an output of the mixer 400.

FIG. 4B is a block diagram of the dual-core double balanced mixer core 401a that forms a portion of the mixer 400 showing LO feedthrough components through the mixer core 401a and at the RF output, according to an embodiment. The mixer core 401a includes the two single cores 402a and 402b that form the dual core mixer core 401a. The mixer core 401a also includes a first splitter 404a that feeds LO+ signals into each of the cores 402a-b and a second splitter 404b that feeds LO− signals into each of the cores 402a-b. The mixer core 401a further includes two combiners or adders 406a-b of the RF outputs of the cores 402a-b.

The cores 402a-b each receive as inputs the IF+ and IF− signals and generate the RF+ and RF− output signals based on input LO+ and LO− signals. For example, the core 402a may have a layout where the LO inputs are located at a top of the core 402a with a (+,−) arrangement from left to right across the top of the core 402a while the core 402b may have a layout where the LO inputs are located at the top of the core 402b with a (−,+) arrangement from left to right across the top of the core 402b. The core 402a may have the IF inputs located along the right side of the core 402a while the core 402b may have the IF inputs located along the left side of the core 402b. The core 402a may have the RF outputs located along a bottom of the core 402a with a (+,−) arrangement from left to right across the bottom of the core 402a while the core 402b may have the RF outputs located at the bottom of the core 402b with a (−, +) arrangement from left to right across the bottom of the core 402b. Thus, the layouts of the cores 402a-b are flipped or are mirror images along a vertical axis through FIG. 4B.

The splitters 404a-b may split the LO signal into two signals to be directed to the cores 402a-b. For example, the splitter 404a may split the LO+ signal into two equal signals to be fed to the cores 402a-b and the splitter 404b may split the LO− signal into two equal signals to be fed to the cores 402a-b. Thus, the splitter 404a may split the LO+ signal into two $$\frac{LO+}{2}$$

signals and each of the cores 402a-b may receive as an input one of the $$\frac{LO+}{2}$$

signals. Similarly, the splitter 404b may split the LO− signal into two $$\frac{LO-}{2}$$

signals and each of the cores 402a-b may receive as an input one of the $$\frac{LO-}{2}$$

signals. In view of the split LO input, the cores 402a-b may generate split RF outputs, where when the cores 402a-b receive input signals of $$\frac{LO(+/-)}{2},$$

the cores 402a-b output signals of $$\frac{RF(+/-)}{2}.$$

When the outputs of the cores 402a-b are merged at the combiners 406a-b, the $$\frac{RF(+/-)}{2}$$

signals are added to result in the RF− signal at the combiner 406a and the RF+ signal at the combiner 406b.

As discussed herein, the various $$\frac{LO(+/-)}{2}$$

components may have α and β factors that, given the flipped layouts of the cores 402a-b, are equal or substantially similar in value. Therefore, the $$\frac{LO(+/-)}{2}$$

components may cancel or substantially cancel when combined at the combiners 406a-b, resulting in only the RF− and RF+ outputs remaining at the outputs of the combiners 406a-b. For example, the cores 402a-b may process the input IF and LO signals to generate the output RF signals as described herein. In view of the layouts of the cores 402a-b, each of the cores 402a-b may generate the αLO and βLO feedthrough components along with respective $$\frac{RF+/-}{2}$$

output components. For example, the core 402b a may generate an output comprising $$\frac{(RF-)+\alpha LO}{2} \text{ and } \frac{(RF+)-\beta LO}{2}$$

components while the core 402b may generate an output comprising $$\frac{(RF-)-\beta LO}{2} \text{ and } \frac{(RF+)+\alpha LO}{2}$$

components. The flipped layouts of the cores 402a-b allows the α and β factors to have the equal or substantially similar values but with opposite signs (for example, the $$\frac{\alpha LO}{2}$$

feedthrough is positive while the $$\frac{\beta LO}{2}$$

feedthrough is negative). Therefore, when the $$\frac{\alpha LO}{2}$$

feedthrough and the $$\frac{\beta LO}{2}$$

feedthrough are combined at the combiner 406a, they cancel or substantial cancel each other out. Based on this, the output RF signal at the output of the combiners 406a-b may be determined according to Equation (2) below:

$$RF\ out=(RF+)-(RF-) \qquad (2)$$

Figure 5:
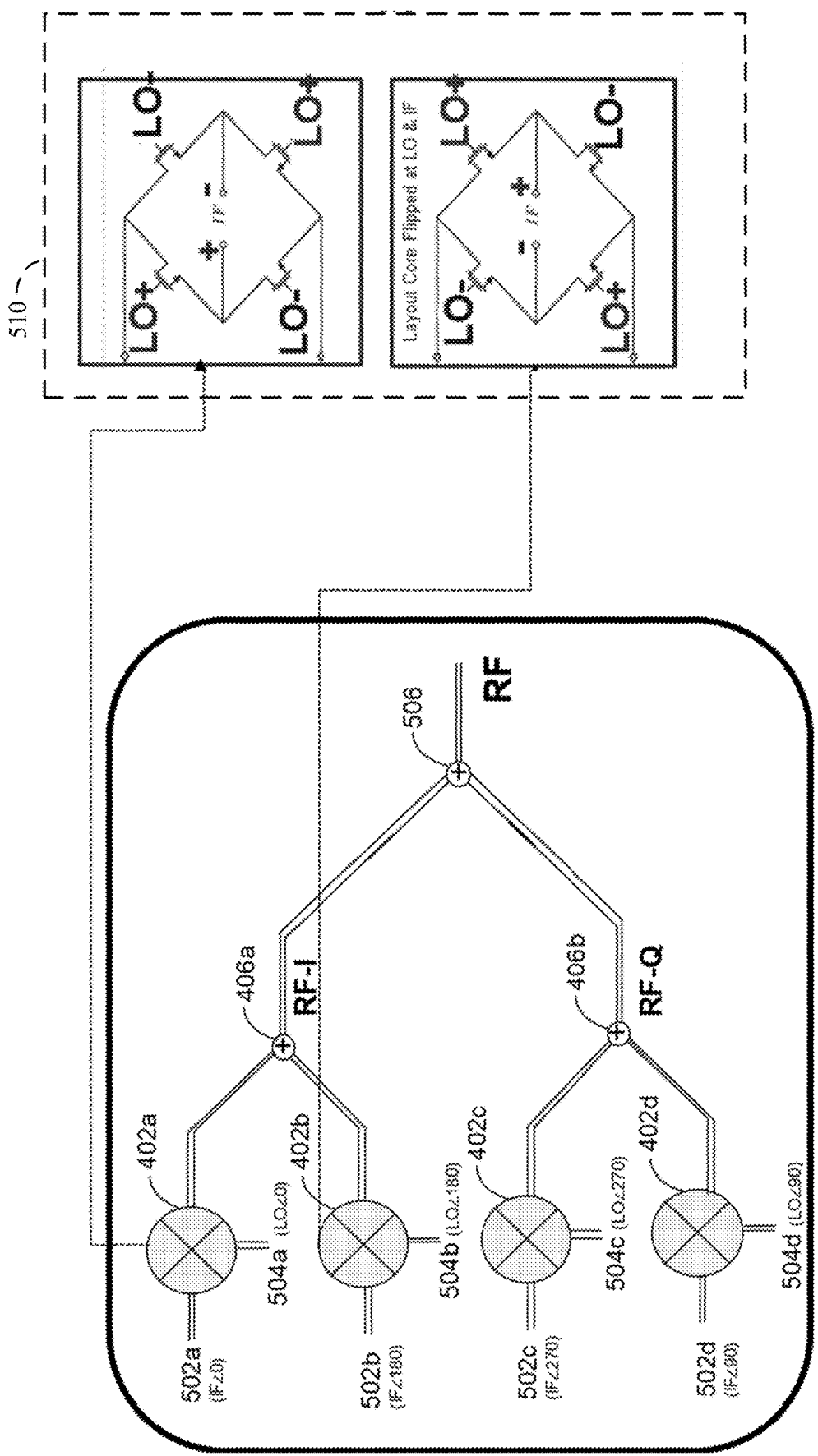
FIG. 5 is a block and schematic diagram of an example dual-core double balanced mixer according to an embodiment.

FIG. 5 is a block and schematic diagram of the example dual-core double balanced mixer 500. As depicted, the mixer 500 may include four of the individual or single mixer cores 402a-d. Each of the cores 402a-d include IF (differential) inputs 502a-d and LO (differential) inputs 504a-d and generate RF (differential) outputs. As shown, the IF and LO inputs may be out-of-phase between each of the cores 402a-d (for example the IF and LO inputs for the core 402a-d have phase angles of 0-degrees, 180-degrees, 270-degrees, and 90-degrees, respectively). Therefore, the RF output generated by each of the cores 402a-d may also be out-of-phase with each other. The mixer 500 includes two combiners (e.g., summers or adders) 406a-b that combine the RF outputs generated by each of the cores 402a-d with one of the other cores 402a-d. For example, combiner 406a may combine the outputs generated by the core 402b a and the core 402b. Similarly, combiner 406b may combine the outputs generated by the cores 402c-d. Finally, the mixer 500 may include a third combiner 506 that combines the RF outputs generated by the combiners 406a-b. The combiner 506 may generate a combined RF signal at its output.

In some embodiments, the cores 402b a and 402b may generate or output RF-I components of the RF signal generated or output by the mixer 500 and the cores 402b c and 402d may generate or output RF-Q components of the RF signal generated or output by the mixer 500. The RF-I and RF-Q components may be combined by the combiner 506 to output the RF signal generated or output by the mixer 500.

In some embodiments, the cores 402b a and 402b (along with the cores 402c and 402d) may have layouts that are flipped, for example along a vertical axis of the page of FIG. 5. As shown in layout 510, each of the mixer cores 502a and 502b may comprise an arrangement of transistors or switches (or similar circuitry). A portion of the layout 510 associated with the core 402b a has LO and IF input terminals of opposite or flipped polarity (or sign) as compared to the layout associated with the core 402b, which results from the portion of the layout 510 associated with the core 402b a being flipped along the vertical axis to generate the portion of the layout 510 associated with the core 402b. Though not shown explicitly here, the layout 510 (and the corresponding polarity relationships) may apply to the cores 402c and 402d.

As discussed herein, the pair of cores 402b a and 402b and the pair of cores 402c and 402d d have inputs that are 180-degrees out-of-phase with each other, respectively, and generate outputs that are 180-degrees out-of-phase with each other in terms of LO and in phase in terms of RF. By being 180-degrees out-of-phase with each other, the paired cores 402a and 402b and paired cores 402c and 402d may have LO feedthrough components and RF output components that are 180-degrees out-of-phase with each other, which may cause at least a significant portion of these LO feedthrough components to cancel with each other when the outputs of the paired cores 402a and 402b (and paired cores 402c and 402d) are combined at the combiner 406a (and 406b).

The dual core mixer layouts described herein in relation to the mixers 400 and 500 may be used to provide various benefits in the mixers 400 and 500. For example, the dual core layouts of the mixers may cancel LO feedthrough components that result from various sources, including core mismatches, LO signal amplitude and/or phase mismatches, and LO harmonics resulting from non-ideal LO amplifiers that drive the mixers 400 and 500. Thus, the dual core mixer layouts may eliminate effects of LO signal phase and/or gain mismatches. In some embodiments, the dual core double balanced mixers described herein may be used in transmitters to generate RF signals with canceled or reduced LO leakage. By using the out-of-phase IF and LO signals between pairs of cores, the LO leakage in the individual cores may be canceled (or substantially canceled) by combining the outputs of the out-of-phase pairs of cores such that the LO leakage components are canceled without additional components (beyond the combiner). Furthermore, the combining of the outputs of the pairs of cores also generates the RF output, therefore providing the LO leakage reduction and the RF output generation with a single operation, thereby potentially reducing processing of the IF, LO, and RF signals.

The dual core mixers described herein may beneficially reduce or eliminate LO leakage that is created in the mixer cores due to an asymmetrical layout of each mixer core. The asymmetrical layout may be caused, in part, due to complicated routing of the inputs for the mixer cores, which may make symmetrical layouts difficult or impossible to create. The use of pairs of mixer cores (e.g., in the dual core layout) to cancel the LO leakage may improve high frequency performance of transmitters that include the mixer. For example, the dual core mixer layouts may provide LO to RF isolation improvements at the transmitter from less than or approximately 45 dB to 60-70 dB. In some embodiments, the dual core mixer layouts may provide improvements of at least 5 dB over double balanced and/or dual matched core layouts.

In some embodiments, the dual core double-balanced passive mixer having layouts described herein may provide a better noise factor (NF) or intermodulation distortion (IM3) NF/IM3 tradeoff as compared to an active mixer with high LO to RF feedthrough. Such a passive mixer may be optimized to operate in 5G applications in a wide band of 24-40 GHz. In some embodiments, the dual core mixer layouts may reduce effects of both LO amplifier's amplitude and phase mismatches. A benefit of LO leakage cancellation or reduction for differential mixer outputs may be a reduction in differential leakage and common mode leakage. In some embodiments, the layouts and configurations described herein may be applied to single output mixers and mixer cores as suitable.

In accordance with any of the embodiments discussed herein, a multi-core mixer can include a first mixer core configured to receive a first local oscillator signal and a second mixer core configured to receive a second local oscillator signal, in which the first local oscillator signal and the second local oscillator signal are approximately 180 degrees out-of-phase. Signals can be approximately 180-degrees out-of-phase when they are in a range from about 170-degrees and 190-degrees out-of-phase.

The mixers disclosed herein can be implemented in a variety of electronic systems. For instance, the mixers discussed herein can be implemented in a receiver, a transmitter, and/or a transceiver. As one example, a mixer in accordance with any suitable principles and advantages discussed herein can up convert a signal to radio frequency using a local oscillator signal from a local oscillator. The up converted signal can be provided to a power amplifier, for example. As another example, a mixer in accordance with any suitable principles and advantages discussed herein can receive a radio frequency signal from a low noise amplifier and down convert the radio frequency signal using a local oscillator signal from a local oscillator. Aspects of the disclosure are applicable to any systems and/or devices that could benefit from reduced local oscillator leakage.

Aspects of this disclosure can be implemented in various electronic devices. For instance, aspects of this disclosure can be implemented in any electronic device or electronic component that could benefit from reduced local oscillator leakage. As an example, aspects of this disclosure can be implemented in any electronic device or electronic component with a transmitter, receiver, or transceiver that could benefit from reduced local oscillator leakage. Examples of the electronic devices can include, but are not limited to, consumer electronic products, parts of the consumer electronic products, electronic test equipment, vehicular electronics systems, and so on. Examples of the electronic devices can include, but are not limited to, computing devices, communications devices, electronic household appliances, automotive electronics systems, etc. Further, the electronic devices can include unfinished products.

Throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A mixer with local oscillator leakage compensation, the mixer comprising:
a first double-balanced mixer core comprising first differential output nodes, the first double-balanced mixer core configured to mix a first input signal with a first differential local oscillator signal, the first differential output nodes configured to provide a first differential output signal based on the first input signal and the first differential local oscillator signal mixed by the first double-balanced mixer core; and
a second double-balanced mixer core comprising second differential output nodes, the second double-balanced mixer core configured to mix a second input signal with a second differential local oscillator signal, the second differential output nodes configured to provide a second differential output signal based on the second input signal and the second differential local oscillator signal mixed by the second double-balanced mixer core, wherein the second differential output signal is approximately in phase with the first differential output signal, wherein a local oscillator feedthrough component in the second differential output signal is approximately 180° out of phase with a local oscillator feedthrough component in the first differential output signal, the second input signal being approximately 180° out of phase with the first input signal, and the second differential local oscillator signal being approximately 180° out of phase with the first differential local oscillator signal;
wherein the first differential output nodes are electrically connected to the second differential output nodes such that the first differential output signal and the second differential output signal are combined, and wherein the first double-balanced mixer core and the second double-balanced mixer core are arranged to substantially cancel local oscillator leakage.

2. The mixer of claim 1, wherein the first differential output nodes of the first-double balanced mixer core and the second-double balanced mixer core are configured to provide a differential radio frequency signal.

3. The mixer of claim 2, further comprising a combiner configured to combine the differential radio frequency signal with another differential radio frequency signal provided by another pair of double-balanced mixer cores that mix the first and second input signals with third and fourth local oscillator signals that are approximately 180° out of phase with each other and at least partially out of phase with the first and second local oscillator signals, respectively.

4. The mixer of claim 3, wherein the combiner is a Wilkinson combiner circuit.

5. The mixer of claim 1, wherein the first double-balanced mixer core has a first layout, the second double-balanced mixer core has a second layout, and the first layout and the second layout are arranged to cause the local oscillator leakage to be reduced.

6. The mixer of claim 5, wherein the first and second layouts are substantially mirror images of each other and contribute to a first local oscillator leakage signal generated by the first double-balanced mixer core being substantially equal in value and opposite in sign with a second local oscillator leakage signal generated by the second double-balanced mixer core.

7. The mixer of claim 1, wherein the mixer is a passive mixer.

8. The mixer of claim 1, further comprising:
a third double-balanced mixer core comprising third differential output nodes, the third double-balanced mixer core configured to mix a third input signal with a third local oscillator signal, the third input signal being approximately 90° out of phase with the first input signal, the third local oscillator signal being approximately 90° out of phase with the first local oscillator signal, and the third differential output nodes configured to provide a third differential output signal; and
a fourth double-balanced mixer core comprising fourth differential output nodes, the fourth double-balanced mixer core configured to mix a fourth input signal with a fourth local oscillator signal, the fourth differential output nodes configured to provide a fourth differential output signal, the fourth input signal being approximately 180° out of phase with the third input signal, and the fourth local oscillator signal being approximately 180° out of phase with the third local oscillator signal,
wherein the third differential output nodes are electrically connected to the fourth differential output nodes, and wherein the third double-balanced mixer core and the fourth double-balanced mixer core are arranged to compensate for local oscillator leakage.

9. A transmitter with local oscillator leakage compensation, the transmitter comprising:
a multi-core mixer configured to upconvert input signals and provide a radio frequency output signal, the multi-core mixer comprising:
a first double-balanced mixer core configured to mix a first input signal with a first local oscillator signal and provide a first differential output signal; and
a second double-balanced mixer core configured to mix a second input signal with a second local oscillator signal and provide a second differential output signal that is approximately in phase with the first differential output signal, wherein a local oscillator feedthrough component in the second differential output signal is approximately 180° out of phase with a local oscillator feedthrough component in the first differential output signal, and wherein the second input signal is approximately 180° out of phase with the first input signal and the second local oscillator signal is approximately 180° out of phase with the first local oscillator signal;
wherein the multi-core mixer is configured to generate the radio frequency output signal by at least combining the first differential output signal from the first double-balanced mixer with the second differential output signal from the second double-balanced mixer so as to substantially cancel local oscillator leakage; and
a radio frequency amplifier comprising an input coupled to an output of the multi-core mixer.

10. The transmitter of claim 9, wherein the first and second input signals are differential input signals, the first and second local oscillator signals are differential local oscillator signals, and the first and second output signals are differential output signals.

11. The transmitter of claim 9, wherein the multi-core mixer further comprises a combiner configured to combine a combination of the first output signal and the second output signal with a second combination signal, the second combination signal being a combination of a third output signal generated by a third double-balanced mixer core and a fourth output signal generated by a fourth double-balanced mixer core.

12. The transmitter of claim 11, wherein the combiner is a Wilkinson combiner circuit.

13. The transmitter of claim 9, wherein the first double-balanced mixer core has a first layout, the second double-balanced mixer core has a second layout, and the first layout and the second layout are arranged to cause the local oscillator leakage to be reduced.

14. The transmitter of claim 13, wherein the first and second layouts are substantially mirror images of each other and contribute to a first local oscillator leakage signal generated by the first double-balanced mixer core being substantially equal in value and opposite in sign with a second local oscillator leakage signal generated by the second double-balanced mixer core.

15. The transmitter of claim 9, wherein the multi-core mixer is a passive mixer.

16. A method of mixing signals with local oscillator leakage compensation, the method comprising:
providing a first local oscillator signal to a first double-balanced mixer core and a second local oscillator signal to a second double-balanced mixer core, wherein the second local oscillator signal is approximately 180° out of phase with the first local oscillator signal;
mixing, with the first double-balanced mixer core, a first input signal with the first local oscillator signal to generate a first differential output signal;
mixing, with the second double-balanced mixer core, a second input signal with the second local oscillator signal to generate a second differential output signal that is approximately in phase with the first differential output signal, wherein a local oscillator feedthrough component in the second differential output signal is approximately 180° out of phase with a local oscillator feedthrough component in the first differential output signal, and wherein the second input signal is approximately 180° out of phase with the first input signal; and
combining the first differential output signal with the second differential output signal to substantially cancel local oscillator leakage.

17. The method of claim 16, wherein combining the first and second differential output signals provides a differential radio frequency signal.

18. The method of claim 17, further comprising combining, with a combiner, the first and second differential output signals with third and fourth differential output signals provided by a third double-balanced mixer core and a fourth double-balanced mixer core, respectively.

19. The method of claim 16, wherein the first double-balanced mixer core has a first layout, the second double-balanced mixer core has a second layout, and the first layout and the second layout are arranged to cause the local oscillator leakage to be reduced.

20. The method of claim 19, wherein the first and second layouts are substantially mirror images of each other and contribute to the first local oscillator leakage signal generated by the first double-balanced mixer core being substantially equal in value and opposite in sign with the second local oscillator leakage signal generated by the second double-balanced mixer core.

* * * * *